(12) United States Patent
Huber et al.

(10) Patent No.: US 6,219,294 B1
(45) Date of Patent: Apr. 17, 2001

(54) MULTIPLEXED NOISY-QUIET POWER BUSING FOR IMPROVED AREA EFFICIENCIES AND PAUSE PERFORMANCE IN DRAM MEMORIES

(75) Inventors: Brian W. Huber, Allen; Mansour Fardad, Rowlett; Roger D. Norwood, McKinney, all of TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/482,575

(22) Filed: Jan. 13, 2000

(51) Int. Cl.$^7$ ........................................ G11C 7/00
(52) U.S. Cl. .................. 365/226; 365/149; 365/189.09; 365/205; 365/206; 365/191
(58) Field of Search ..................... 365/226, 189.09, 365/191, 206, 189.01, 149, 205

(56) References Cited

U.S. PATENT DOCUMENTS

| | | | |
|---|---|---|---|
| 4,774,691 | 9/1988 | Hidaka | 365/203 |
| 4,907,199 | 3/1990 | Dosaka et al. | 365/189.04 |
| 4,943,960 | 7/1990 | Komatsu et al. | 365/222 |
| 5,042,011 | 8/1991 | Casper et al. | 365/205 |
| 5,132,575 | 7/1992 | Chern | 327/51 |
| 5,185,719 | 2/1993 | Dhong et al. | 365/189.01 |
| 5,280,205 | 1/1994 | Green et al. | 327/51 |
| 5,317,532 * | 5/1994 | Ochii | 365/194 |
| 5,532,965 | 7/1996 | Kenney | 200/200 |
| 5,627,785 | 5/1997 | Gilliame et al. | 365/189.01 |
| 5,719,814 * | 2/1998 | Ishikawa | 365/205 |
| 5,875,140 | 2/1999 | Merritt et al. | 365/203 |

* cited by examiner

Primary Examiner—David Nelms
Assistant Examiner—Hoai V. Ho
(74) Attorney, Agent, or Firm—Dickstein Shapiro Morin & Oshinsky LLP

(57) ABSTRACT

A DRAM memory device having two sets of power buses is provided. Each set includes a first bus having a first potential and a second bus having a second potential, both of which are required to activate a row of memory within a bank of memory. A first row is activated while it is connected to the first set of buses. If it is detected that the activation of a second row connected to the first set of buses will cause a power bump when it is time to deactivate the first row, the first row is switched over to the second set of buses prior to the activation of the second row. The first row can be precharged with the voltages from the second set of buses and the second row can be activated with the voltages from the first set of buses. Thus, the first row can be precharged without being adversely effected by the power bump on the first set of buses which improves the pause performance of the DRAM.

43 Claims, 15 Drawing Sheets

US 6,219,294 B1

MULTIPLEXED NOISY-QUIET POWER BUSING FOR IMPROVED AREA EFFICIENCIES AND PAUSE PERFORMANCE IN DRAM MEMORIES

BACKGROUND OF THE INVENTION

1. Field of the Invention

The present invention relates to the field of semiconductor memory devices and, more particularly to a multiplexed noisy-quiet power busing scheme for improved area efficiency and pause performance in dynamic random access memories.

2. Description of the Related Art

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 10. Each cell 10 contains a storage capacitor 14 and an access field effect transistor or transfer device 12. For each cell, one side of the storage capacitor 14 is connected to a reference voltage (illustrated as a ground potential for convenience purposes). The other side of the storage capacitor 14 is connected to the drain of the transfer device 12. The gate of the transfer device 12 is connected to a signal known in the art as a word line 18. The source of the transfer device 12 is connected to a signal known in the art as a bit line 16 (also known in the art as a digit line). With the memory cell 10 components connected in this manner, it is apparent that the word line 18 controls access to the storage capacitor 14 by allowing or preventing the signal (representing a logic "0" or a logic "1") carried on the bit line 16 to be written to or read from the storage capacitor 14. Thus, each cell 10 contains one bit of data (i.e., a logic "0" or logic "1").

Referring to FIG. 2, an exemplary DRAM circuit 40 is illustrated. The DRAM 40 contains a memory array 42, row and column decoders 44, 48 and a sense amplifier circuit 46. The memory array 42 consists of a plurality of memory cells (constructed as illustrated in FIG. 1) whose word lines and bit lines are commonly arranged into rows and columns, respectively. The bit lines of the memory array 42 are connected to the sense amplifier circuit 46, while its word lines are connected to the row decoder 44. Address and control signals are input into the DRAM 40 and connected to the column decoder 48, sense amplifier circuit 46 and row decoder 44 and are used to gain read and write access, among other things, to the memory array 42.

The column decoder 48 is connected to the sense amplifier circuit 46 via control and column select signals. The sense amplifier circuit 46 receives input data destined for the memory array 42 and outputs data read from the memory array 42 over input/output (I/O) data lines. Data is read from the cells of the memory array 42 by activating a word line (via the row decoder 44), which couples all of the memory cells corresponding to that word line to respective bit lines, which define the columns of the array. One or more bit lines are also activated. When a particular word line is activated, the sense amplifier circuit 46 connected to a bit line column detects and amplifies the data bit transferred from the storage capacitor of the memory cell to its bit line by measuring the potential difference between the activated bit line and a reference line which may be an inactive bit line. The operation of DRAM sense amplifiers is described, for example, in U.S. Pat. Nos. 5,627,785; 5,280,205; and 5,042, 011, all assigned to Micron Technology Inc., and incorporated by reference herein.

Typically, the memory of a DRAM is subdivided into quadrants of memory. A quadrant may contain a bank, partial bank, multiple banks or multiple partial banks. In addition, a bank will contain one or more sub arrays. FIG. 3 illustrates the DRAM 40 with a memory array 42A that is subdivided into four quadrants $Q_1$, $Q_2$, $Q_3$, $Q_4$. FIG. 4 illustrates how the DRAM memory quadrants are also often further subdivided into sub arrays $S_1$, $S_2$, ... $S_N$. Each sub array $S_1$, $S_2$, ... $S_N$ is connected to respective local row decoders $44_1$, $44_2$, ... $44_N$ and sense amplifier circuits $46_1$, $46_2$, ... $46_N$ (other circuitry such as a column decoder and the I/O lines are not shown). In addition, a gap $58_1$, $58_2$, ... $58_N$ is found at respective intersections of the local row decoders $44_1$, $44_2$, ... $44_N$ and sense amplifier circuits $46_1$, $46_2$, ... $46_N$ for each sub array $S_1$, $S_2$, ... $S_N$. Although not required, these gaps $58_1$, $58_2$, ... $58_N$ typically include sense amplifier control circuitry (illustrated in FIG. 5) used to control associated sense amplifier circuits $46_1$, $46_2$, ... $46_N$. The sense amplifier control circuitry is usually contained within the gaps $58_1$, $58_2$, ... $58_N$ to conserve precious space on the DRAM chip.

Referring now to FIGS. 4 and 5, a control circuit 60 is connected to the sense amplifier control circuitry 64 of each gap $58_1$, $58_2$, ... $58_N$ (designated in FIG. 5 as gap $58_X$) via sense amplifier control lines LPSA__, LNSA. The sense amplifier control circuit 64 (FIG. 5) contains a p-channel metal-oxide semiconductor field-effect transistor (MOSFET) 66 and an n-channel MOSFET 68. A voltage bus, designated generally as $V_{CC}$ or $V_{CC}$ bus, is connected to a source terminal of the p-channel MOSFET 66. A ground potential bus, designated generally as GND or GND bus, is connected to a source terminal of the n-channel MOSFET 68. It should be noted that the sense amplifier control circuitry 64 would also contain additional circuitry, such as conventional biasing circuitry, but the additional circuitry is not pertinent to the present invention.

The first sense amplifier control signal LPSA__ is used to activate the p-channel MOSFET 66 during a row activation process. When activated, the MOSFET 66 switches in the voltage from the $V_{CC}$ bus to generate a p-sense amplifier activation signal ACT. As is known in the art, the p-sense amplifier activation signal ACT is used to activate a p-sense amplifier portion (not shown) of the sense amplifier circuit $46_X$ during a row activation operation. The second sense amplifier control signal LNSA is used to activate the n-channel MOSFET 68 during a row activation operation. When activated, the MOSFET 68 switches in the ground potential from the GND bus to generate an n-sense amplifier activation signal RNL__. As is known in the art, the n-sense amplifier activation signal RNL__ is used to activate an n-sense amplifier portion (not shown) of the sense amplifier circuit $46_X$ during a row activation operation. It should be appreciated that the particular circuitry of the sense amplifier circuit $46_X$ is not pertinent to the practice of the invention.

Referring to FIG. 6, it can be seen that prior to the generation of the p-sense amplifier activation signal ACT and the n-sense amplifier activation signal RNL__, that the VCC bus is at a potential equivalent to Vcc, while the GND bus is at a GND potential. Immediately after the generation of the ACT and RNL__ signals, the potential of the $V_{CC}$ bus drops below Vcc, while the potential of the GND bus rises above the GND potential. That is, immediately after the generation of the ACT and RNL__ signals, the $V_{CC}$ bus experiences a "bump" down in voltage, while the GND bus experiences a "bump" up in voltage (hereinafter, these bumps will be collectively referred to as "power bumps"). These power bumps occur because there is a large current drain when the sense amplifier circuitry becomes active.

Eventually, the power pumps decay back to the Vcc and GND potentials. As shown in FIG. 6, however, a series of ACT and RNL__ signals will cause the power bumps on $V_{CC}$ and GND buses to get slightly larger, preventing the $V_{CC}$ bus from having a Vcc potential and the GND bus from having a GND potential during that time (due to the summation of decayed bumps with the present bump). In addition, both buses will experience some noise.

DRAM devices are the most cost effective high speed memory used with computers and computer systems. They are available in very high density. They are, however, limited in the longevity of their memory. DRAM devices require constant refreshing and lose all knowledge of their state (i.e., contents) once power to the device is removed. This occurs because the DRAM cells utilize capacitors, which discharge over time.

The term "pause" is often used to represent the amount of time that a DRAM cell, or group of cells, can maintain their charge without undergoing a refresh operation. That is, how long can the DRAM control circuitry pause between refresh operations and still maintain the stored state of the DRAM memory cell. It is desirable to extend the pause period of the DRAM.

A manufacturer may want to extend the pause period and thus, improve the pause performance of the DRAM to provide customers with the capability to perform more memory operations (e.g., reads and writes) between refresh cycles. This reduces the overhead required to utilize the DRAM. Moreover, a manufacturer may want to extend the pause period to improve the operating specifications of the DRAM. For example, DRAMs typically have a low-power or standby specification requiring the DRAM to operate within a maximum current during a low-power mode. Since memory cells must be refreshed during the lower-power mode, reducing the frequency of the refresh operations will improve the DRAM's operational performance for the low-power mode. Thus, there is a desire and need to improve the pause performance of DRAM memory devices.

Maximizing or minimizing the actual voltage level that a DRAM memory cell achieves for a "1" or a "0" during a write or refresh cycle is critical to achieving good pause performance. Array power busing is a part of this process. For architectures that allow separate power busing per bank (a bank meaning the maximum memory region that just one logical row can be addressed at a time), the power busing required is not too stringent since the power buses have time to recover between successive row accesses to the same bank. However, for architectures that require multiple banks to share common array power buses such as the DRAM illustrated in FIGS. 3–4, the current required to be delivered through the array power busing can increase many fold over that of a single bank-power bus scenario.

Additionally, the large power bumps that occur when a row is activated in a bank (i.e., when the p-sense and n-sense amplifier activation signals ACT, RNL__ are generated) may coincide with a row precharge operation (i.e., a refresh operation) being performed in another bank within the same array power grid. A significant portion of these power bus bumps, such as the ones illustrated in FIG. 6, transmit directly in to the memory cells of the row being precharged (also known as a row deactivation). That is, since there is a bump in the $V_{CC}$ and GND buses, the voltage level being stored into the cells is less than Vcc or greater than GND. This results in reduced cell voltage levels, and correspondingly reduced pause because a full charge has not been stored in the cell. As illustrated in FIG. 6, the power bumps get larger as the row activations are relatively close to each other. This further reduces the pause period and thus, pause performance of the DRAM. Accordingly, there is a desire and need for a power busing technique that improves the pause performance of DRAM memory devices.

SUMMARY OF THE INVENTION

The present invention provides a power busing technique that improves the pause performance of DRAM memory devices.

The above and other features and advantages of the invention are achieved by providing a DRAM memory device having two sets of power buses. Each set includes a first bus having a first potential and a second bus having a second potential, both of which are required to activate a row of memory within a bank of memory. A first row is activated while it is connected to the first set of buses. If it is detected that the activation of a second row connected to the first set of buses will cause a power bump when it is time to deactivate the first row, the first row is switched over to the second set of buses prior to the activation of the second row. The first row can be precharged with the voltages from the second set of buses and the second row can be activated with the voltages from the first set of buses. Thus, the first row can be precharged without being adversely effected by the power bump on the first set of buses which improves the pause performance of the DRAM.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
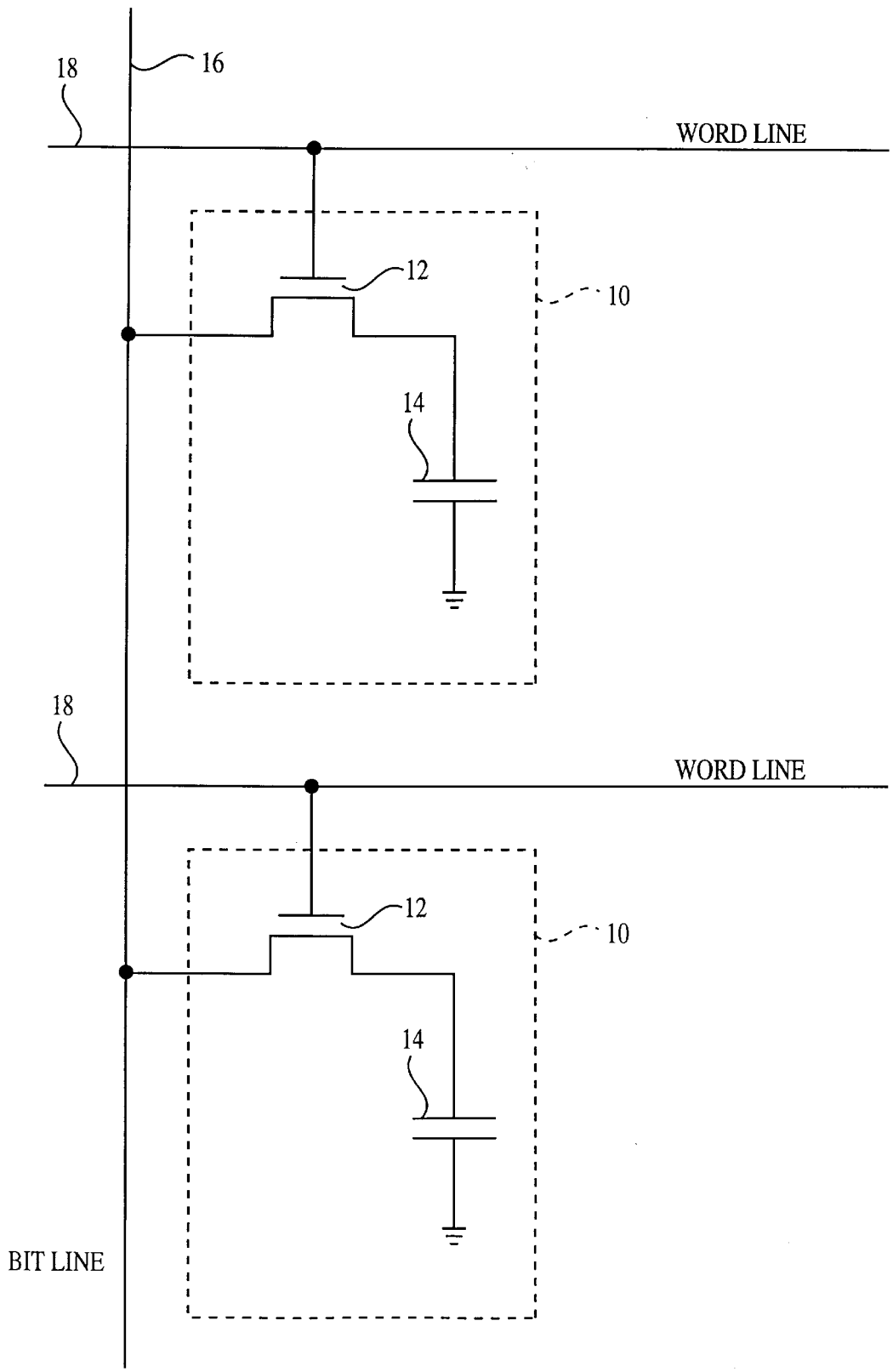
FIG. 1 is a circuit diagram illustrating conventional dynamic random access memory (DRAM) cells.
Figure 2:
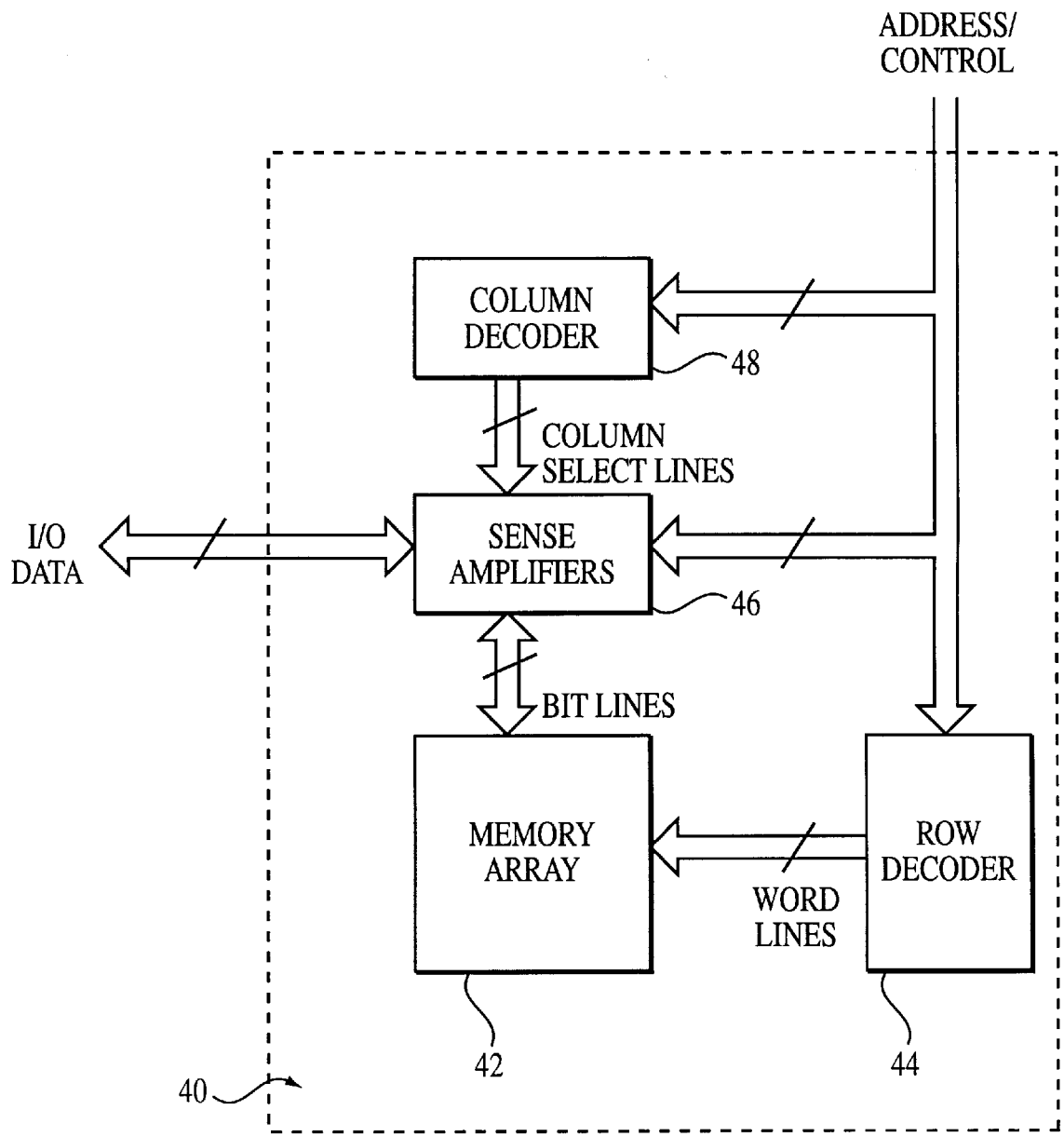
FIG. 2 is a block diagram illustrating a DRAM device.
Figure 3:
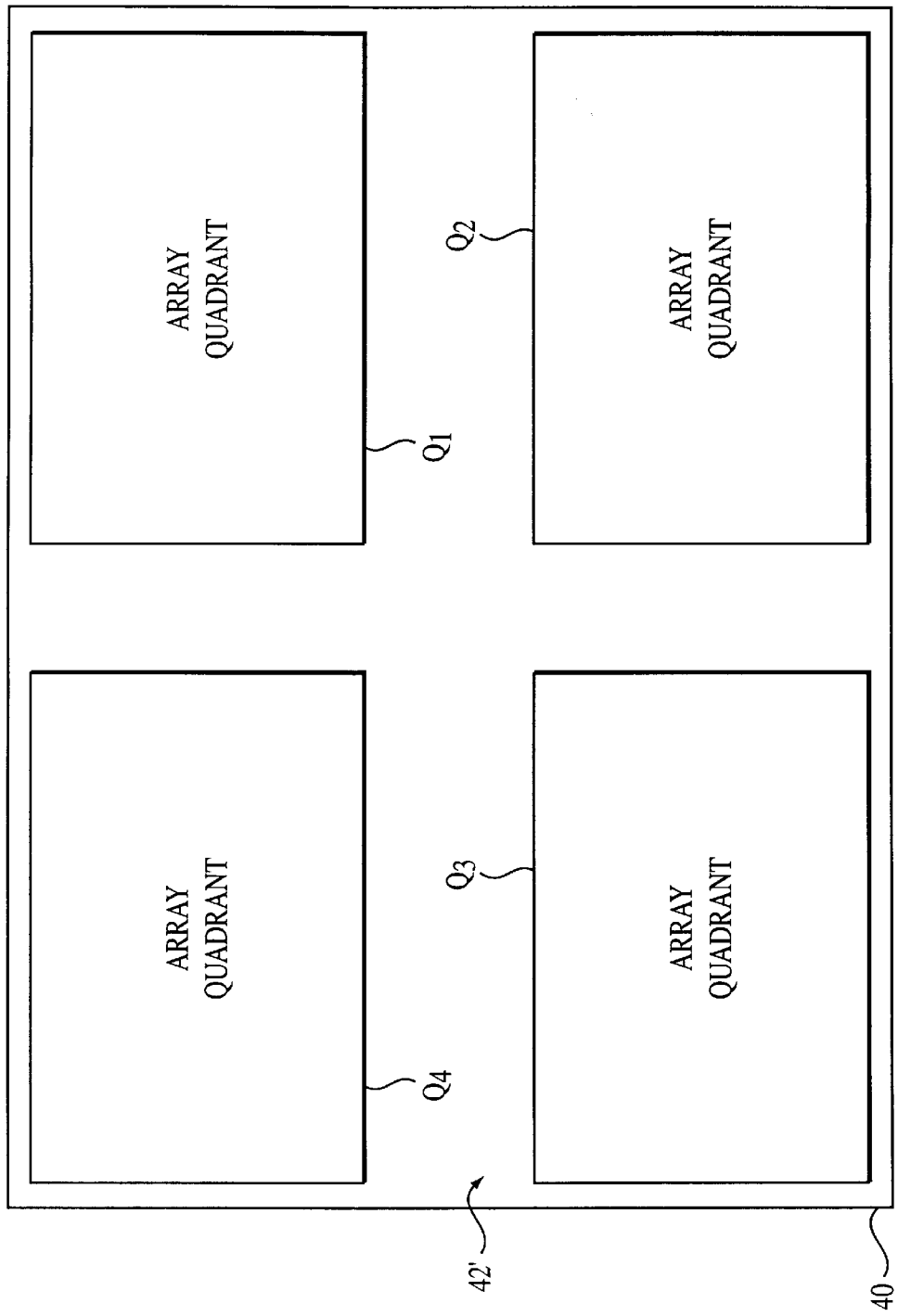
FIG. 3 illustrates a DRAM device having a memory array divided into quadrants.
Figure 4:
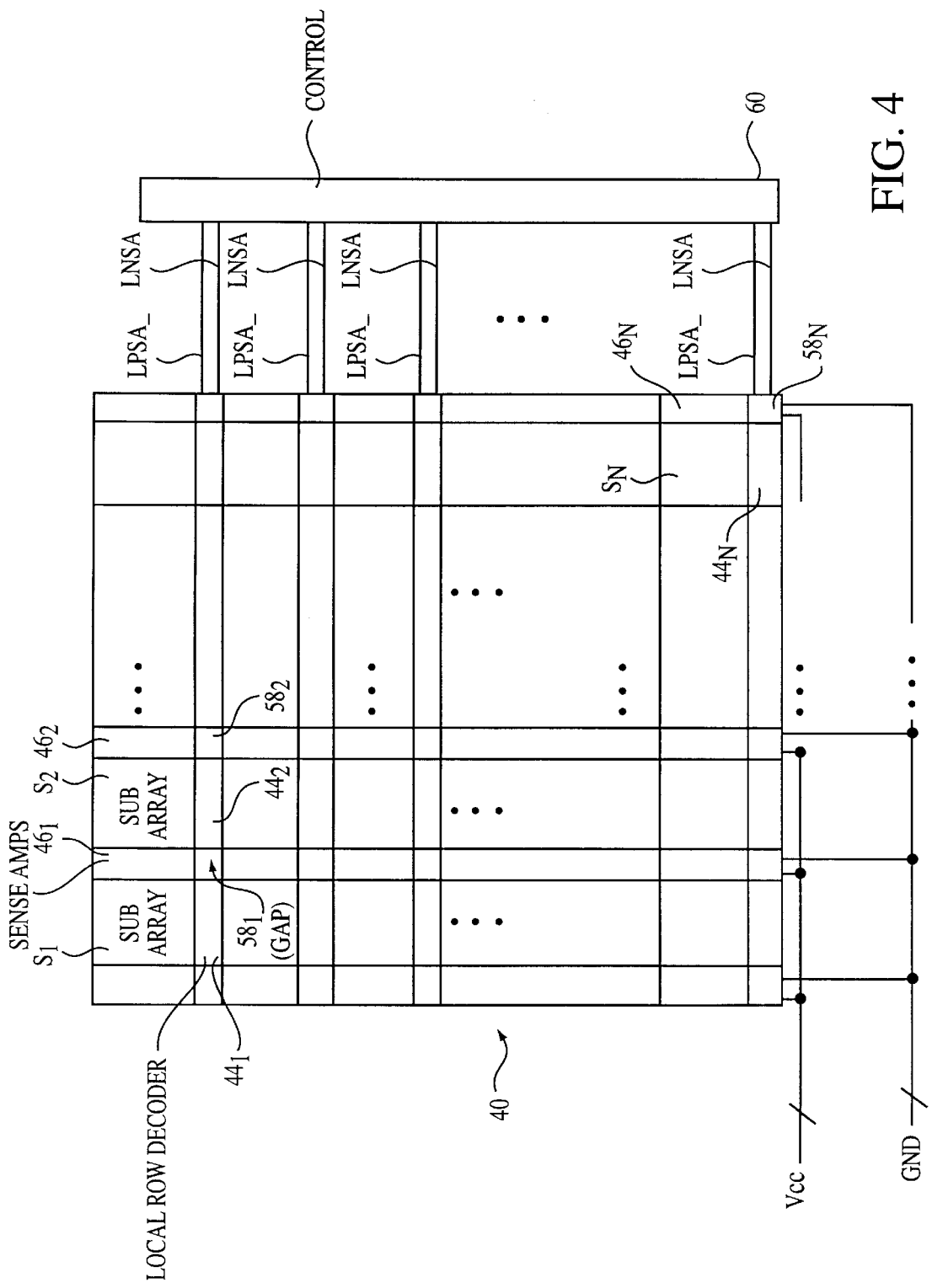
FIG. 4 illustrates a DRAM device having a memory array divided into sub arrays.
Figure 7:
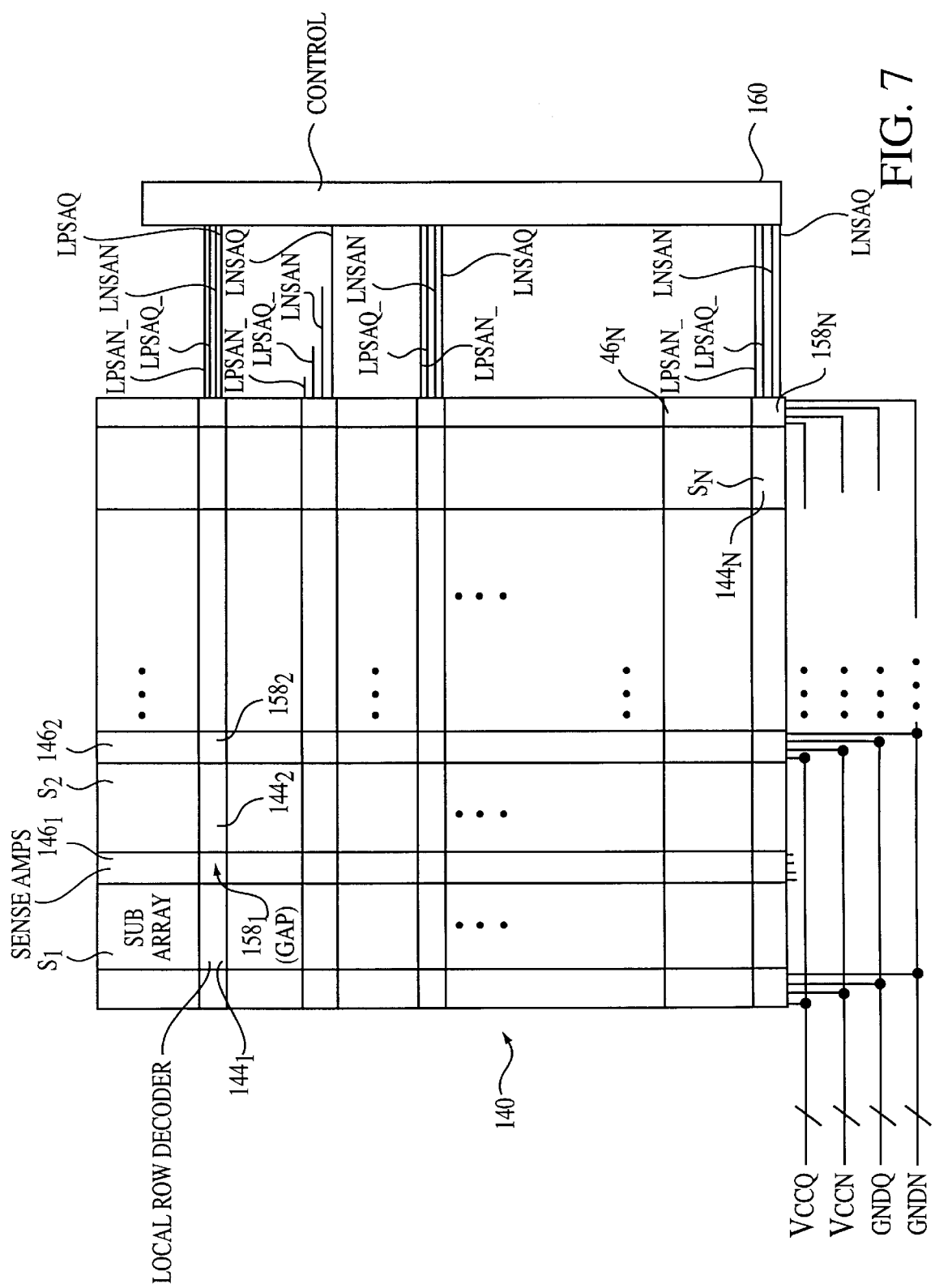
FIG. 7 illustrates a DRAM device having a memory array divided into sub banks constructed in accordance with the present invention.

FIG. 7 illustrates a DRAM 140 constructed in accordance with the present invention. Similar to the DRAM 40 illustrated in FIG. 4, the DRAM 140 contains memory banks that are subdivided into sub arrays or sub banks $S_1, S_2, \ldots S_N$. Each sub bank $S_1, S_2, \ldots S_N$ is connected to respective local row decoders $144_1, 144_2, \ldots 144_N$ and sense amplifier circuits $146_1, 146_2, \ldots 146_N$. In addition, a gap $158_1, 158_2, \ldots 158_N$ is found at respective intersections of the local row decoders $144_1, 144_2, \ldots 144_N$ and sense amplifier circuits $146_1, 146_2, \ldots 146_N$ for each sub bank $S_1, S_2, \ldots S_N$. The gaps $158_1, 158_2, \ldots 158_N$ include sense amplifier control circuitry (illustrated in FIG. 8) used to control associated sense amplifier circuits $146_1, 146_2, \ldots 146_N$. As noted above with respect to FIG. 4, the sense amplifier control circuitry does not have to be placed within the gaps $158_1, 158_2, \ldots 158_N$, but it is desirable to do so to conserve precious space on the DRAM 140.

Figure 5:
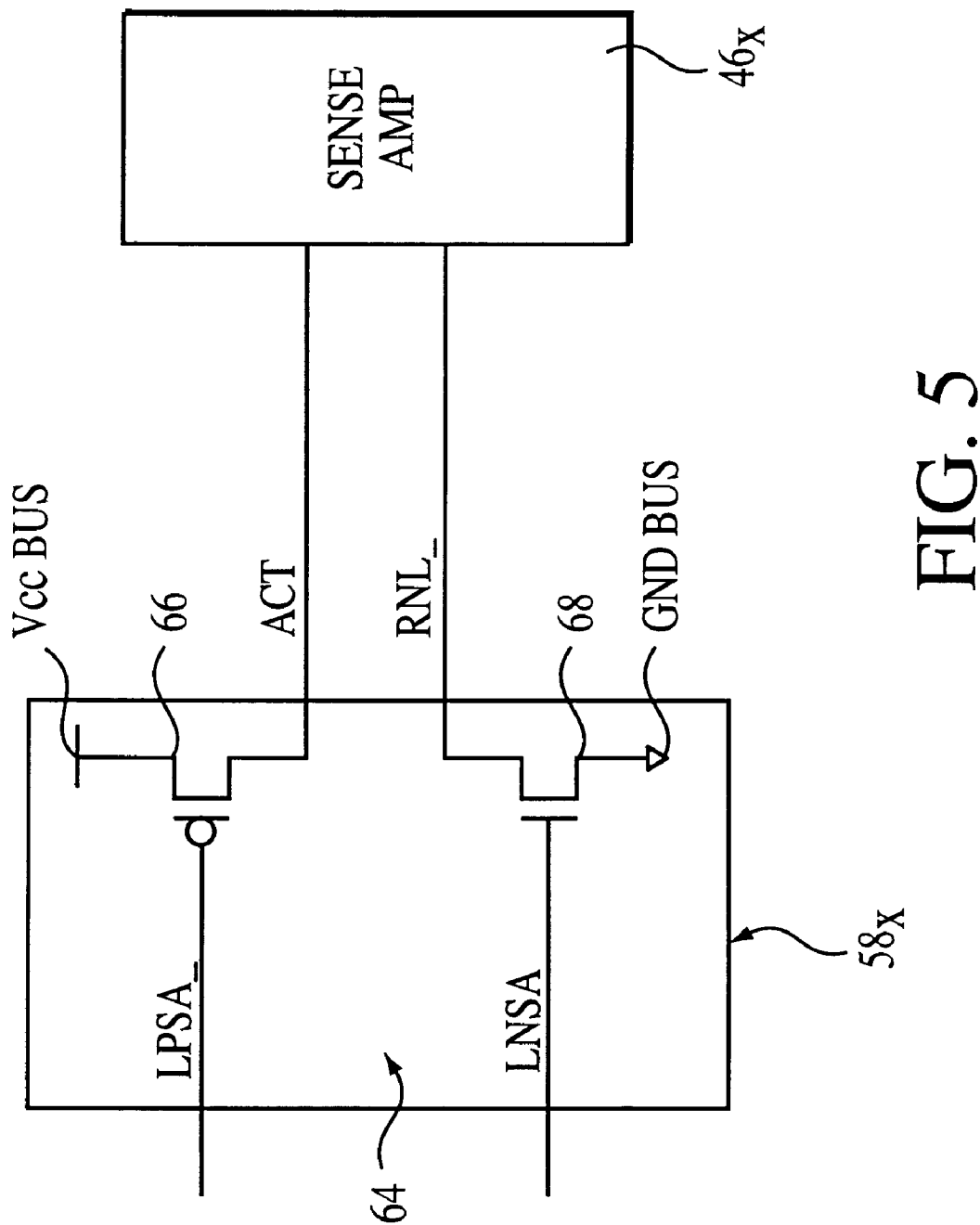
FIG. 5 illustrates sense amplifier control circuitry used in the memory arrays illustrated in FIG. 4.

The DRAM 140 now contains two sets of power buses. The first set includes a first voltage bus, designated generally as $V_{CCN}$ or $V_{CCN}$ bus, and a first ground potential bus, designated generally as GNDN or GNDN bus. The $V_{CCN}$ and GNDN buses are essentially the same as the $V_{CC}$ and GND buses illustrated in FIGS. 4 and 5. That is, they are the main power buses of the DRAM 140. Although the exact size of the $V_{CCN}$ and GNDN buses is not important, they are approximately 30 μm in width since they are to be used as the main power buses. Since they are the main power buses for the DRAM 140, the $V_{CCN}$ and GNDN buses would typically experience some noise and thus, the $V_{CCN}$ and GNDN buses will be referred to as the "noisy buses" (hence the designation "N").

Figure 6:
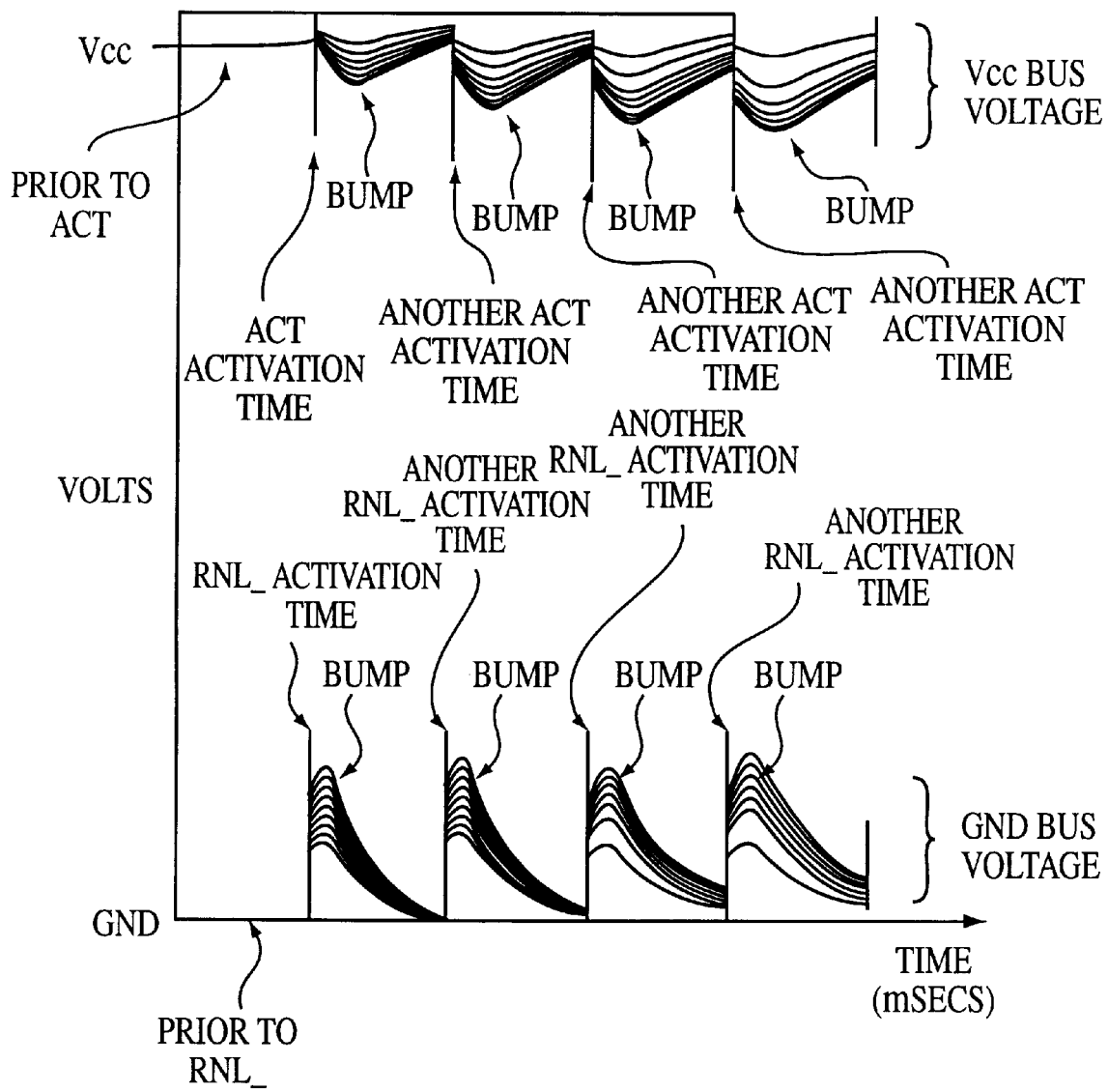
FIG. 6 is a diagram illustrating the power bumps that occur during a row activation.

The second set of power buses includes a second voltage bus, designated generally as $V_{CCQ}$ or $V_{CCQ}$ bus, and a second ground potential bus, designated generally as GNDQ or GNDQ bus. The $V_{CCQ}$ and GNDQ buses are auxiliary buses and are not to be used as the main power buses of the DRAM 140. As will be described below in more detail with reference to FIGS. 9 to 13, these buses are used only when it is necessary to prevent power bumps (FIG. 6) from effecting a precharge of memory cells that were previously connected to the noisy buses (i.e., the $V_{CCN}$ and GNDN buses). That is, the $V_{CCQ}$ and GNDQ buses are used to insulate activated rows connected to the noisy buses from power variations on the noisy buses. Since the $V_{CCQ}$ and GNDQ buses are switched in only when necessary, they can be approximately one to three μm in width. Although the exact size of the $V_{CCQ}$ and GNDQ buses does not matter, it is desirable to use as little chip space as possible, since chip space is a valuable commodity in a DRAM architecture. The $V_{CCQ}$ and GNDQ buses can be this small since they will not be used as the main power buses for the DRAM 140. Moreover, since they are not being used as the main power buses for the DRAM 140, the $V_{CCQ}$ and GNDQ buses will typically experience very little noise and thus, the $V_{CCQ}$ and GNDQ buses will be referred to herein as the "quiet buses" (hence the designation "Q").

Figure 8:
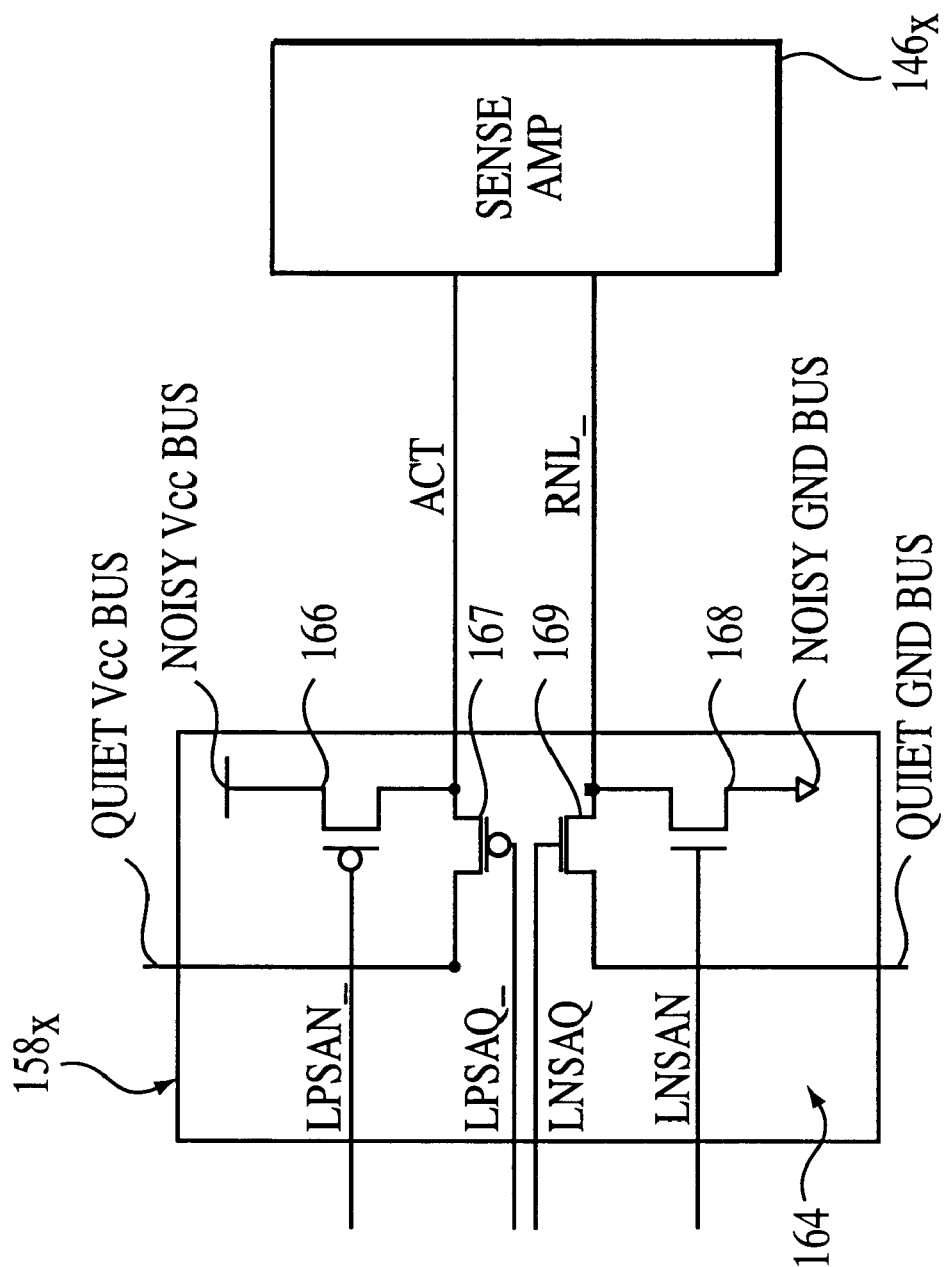
FIG. 8 illustrates sense amplifier control circuitry used in the memory arrays illustrated in FIG. 7.

Referring now to FIGS. 7 and 8, a control circuit 160 is connected to the sense amplifier control circuitry 164 of each gap $158_1, 158_2, \ldots 158_N$ (designated in FIG. 8 as gap $158_X$) via four sense amplifier control lines LPSAN__, LPSAQ__, LNSAN, LNSAQ. The control circuit 160 can be implemented in on-chip hardware, it can be a programmed microprocessor or an application specific integrated circuit (ASIC). The sense amplifier control circuit 164 (FIG. 8) now contains two p-channel MOSFETs 166, 167 and two n-channel MOSFETs 168, 169. The first voltage bus $V_{CCN}$ is connected to a source terminal of the first p-channel MOSFET 166 and the second voltage bus $V_{CCQ}$ is connected to a source terminal of the second p-channel MOSFET 167. The first ground GNDN bus is connected to a source terminal of the first n-channel MOSFET 168 and the second ground GNDQ bus is connected to a source terminal of the second n-channel MOSFET 169. It should be noted that the sense amplifier control circuitry 164 would also contain additional circuitry, such as conventional biasing circuitry, but the additional circuitry is not pertinent to the present invention.

The first sense amplifier control signal LPSAN__ is used to activate the first p-channel MOSFET 166 during a row activation process when it is desired that the $V_{CCN}$ bus supply a Vcc potential to the sense amplifier circuit $146_X$. When activated, the first p-channel MOSFET 166 switches in the voltage from the $V_{CCN}$ bus to generate a p-sense amplifier activation signal ACT. The second sense amplifier control signal LPSAQ__ is used to activate the second p-channel MOSFET 167 during a row activation process when it is desired that the $V_{CCQ}$ bus supply a Vcc potential to the sense amplifier circuit $146_X$. When activated, the second p-channel MOSFET 167 switches in the voltage from the $V_{CCQ}$ bus to generate a p-sense amplifier activation signal ACT. As is known in the art, the p-sense amplifier activation signal ACT is used to activate a p-sense amplifier portion (not shown) of the sense amplifier circuit $146_X$ during a row activation operation.

The third sense amplifier control signal LNSAN is used to activate the first n-channel MOSFET 168 during a row activation operation when it is desired that the GNDN bus supply a GND potential to the sense amplifier circuit $146_X$. When activated, the first n-channel MOSFET 168 switches in the ground potential from the GNDN bus to generate an n-sense amplifier activation signal RNL__. The fourth sense amplifier control signal LNSAQ is used to activate the second n-channel MOSFET 169 during a row activation operation when it is desired that the GNDQ bus supply a GND potential to the sense amplifier circuit $146_X$. When activated, the second n-channel MOSFET 169 switches in the ground potential from the GNDQ bus to generate the n-sense amplifier activation signal RNL__. As is known in the art, the n-sense amplifier activation signal RNL__ is used to activate an n-sense amplifier portion (not shown) of the sense amplifier circuit $146_X$ during a row activation operation. It should be appreciated that the particular circuitry of the sense amplifier circuit $146_X$ is not pertinent to practice that invention.

Figure 9:
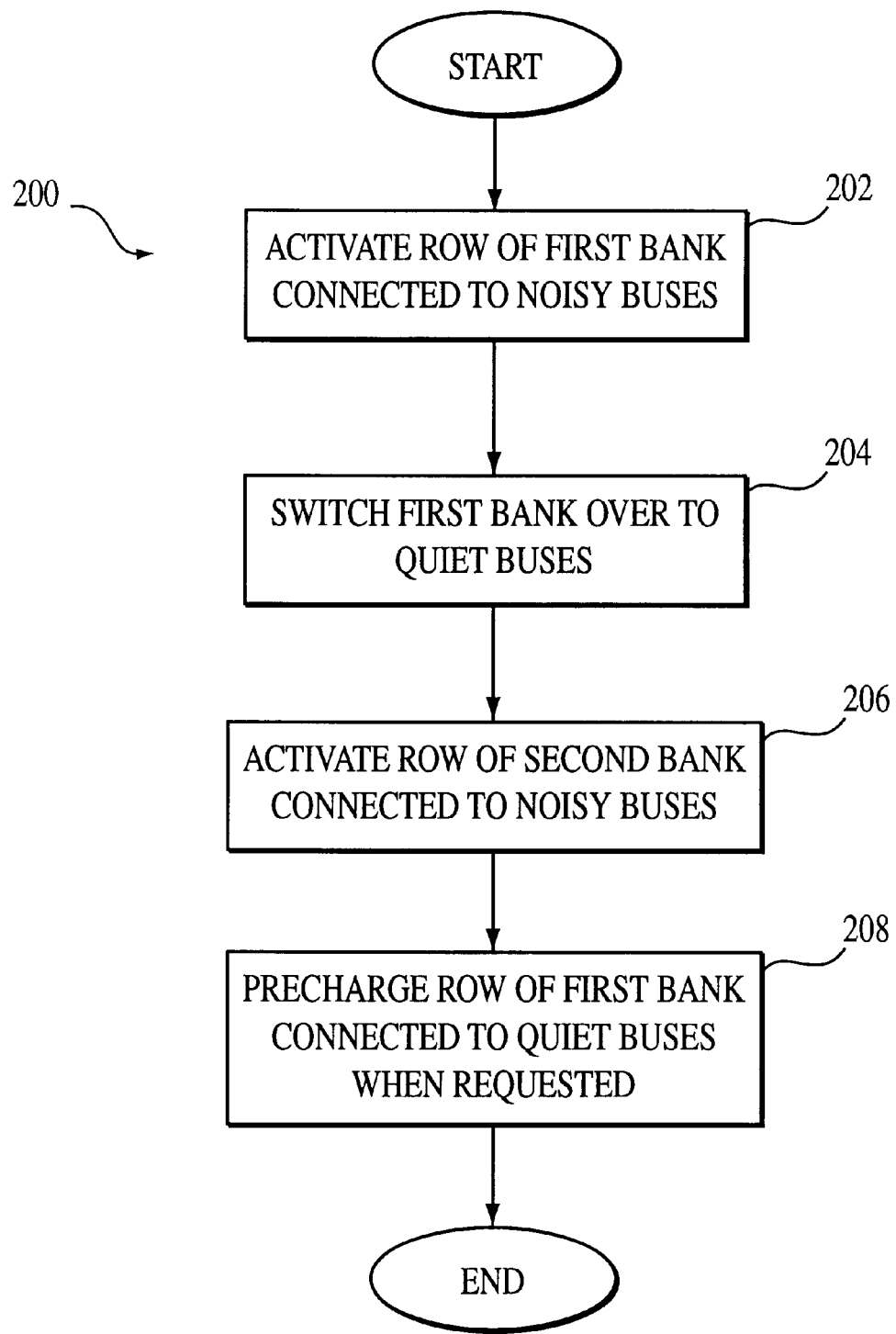
FIG. 9 illustrates a first exemplary method of operating a DRAM device constructed in accordance with the present invention.

Thus, the architecture of the DRAM 140 of the present invention contains two sets of power buses (i.e., the noisy buses comprising the $V_{CCN}$ and GNDN buses and the quiet buses comprising the $V_{CCQ}$ and GNDQ buses) and a mechanism for multiplexing between the two sets of buses (the four sense amplifier control signals LPSAN__, LPSAQ__, LNSAN, LNSAQ and the four MOSFETs 166, 167, 168, 169). FIG. 9 illustrates an exemplary method 200 of operating the DRAM 140 to improve its pause performance.

The method 200 which is performed by the control circuitry 160 (FIG. 8) begins with the activation of a row within a first bank of memory that is connected to the noisy buses (at 202). It should be noted that the term "bank" is used hereinafter to refer to any bank, sub bank or sub array connected to the same power buses through their respective sense amplifier and sense amplifier control circuitry. To perform the row activation using the noisy buses, the control circuitry generates the first and third sense amplifier control signals LPSAN__, LNSAN, which cause the MOSFETs 166, 168 to switch in the $V_{CCN}$ and GNDN buses and generate the ACT and RNL__ signals, respectively.

As known in the art, every DRAM typically has a specification indicating the minimum amount of time between row activations. Similarly, the DRAM will have a specification indicating the minimum amount of time between a row activation and a precharge operation. As noted above with reference to FIG. 6, the row activation causes a power bump on the noisy buses. It is desirable to avoid precharging a row during this bump. Thus, when it is time to activate another row connected to the noisy buses, the first bank is switched over to the quiet buses (at 204). The switching occurs when the control circuitry generates the second and fourth sense amplifier control signals LPSAQ__, LNSAQ, which cause the MOSFETs 167, 169 to switch in the $V_{CCQ}$ and GNDQ buses. Since the first and third sense amplifier control signals will not be generated at this time, the $V_{CCN}$ and GNDN buses are disconnected from the first bank. It should be noted that the switching should occur after the power bumps decay significantly to minimize any noise problems, which can be accomplished by the control circuitry in any manner, including but not limited to waiting for a predetermined amount time (i.e., a known time at which the bumps decay significantly) or checking the voltage level of the buses.

Once switched, the method 200 proceeds by activating a row within a second bank of memory that is connected to the noisy buses (at 206). The row within the first bank that was activated while connected to the noisy buses, but is now connected to the quiet buses, is precharged (at 208). Since the row is connected to the quiet buses (i.e., $V_{CCQ}$ and GNDQ buses), power bumps caused by the activation of the row connected to the noisy buses (i.e., $V_{CCN}$ and GNDN) are not present. Thus, the row is precharged with the nearly full Vcc and GND potentials, which as noted above, will improve the pause performance of the memory. That is, the quiet buses were used to insulate the activated row from the power variations on the noisy buses.

Figure 10:
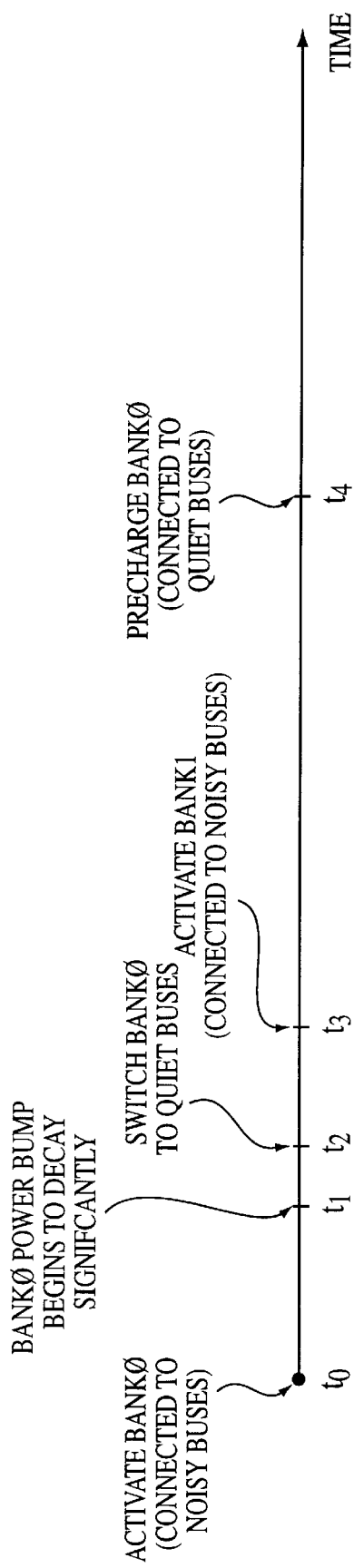
FIG. 10 is a time line illustrating an exemplary sequence of events corresponding to the method of FIG. 9.

The method 200 is further illustrated by the exemplary time line of FIG. 10. Referring to FIGS. 9 and 10, at time t0 a row within the first bank ("bank 0") that is connected to the noisy buses is activated (described above with respect to block 202). This activation causes a power bump on the noisy buses. At time t1 the power bump decays significantly. At time t2, bank 0 is switched over to the quiet buses (described above with respect to block 204). Shortly thereafter, at time t3 a row within the second bank ("bank 1") that is connected to the noisy buses is activated (described above with respect to block 206). Subsequently, at time t4 the activated row of bank 0 that is now connected to the quiet buses is precharged (described above with respect to block 208).

Figure 11A:
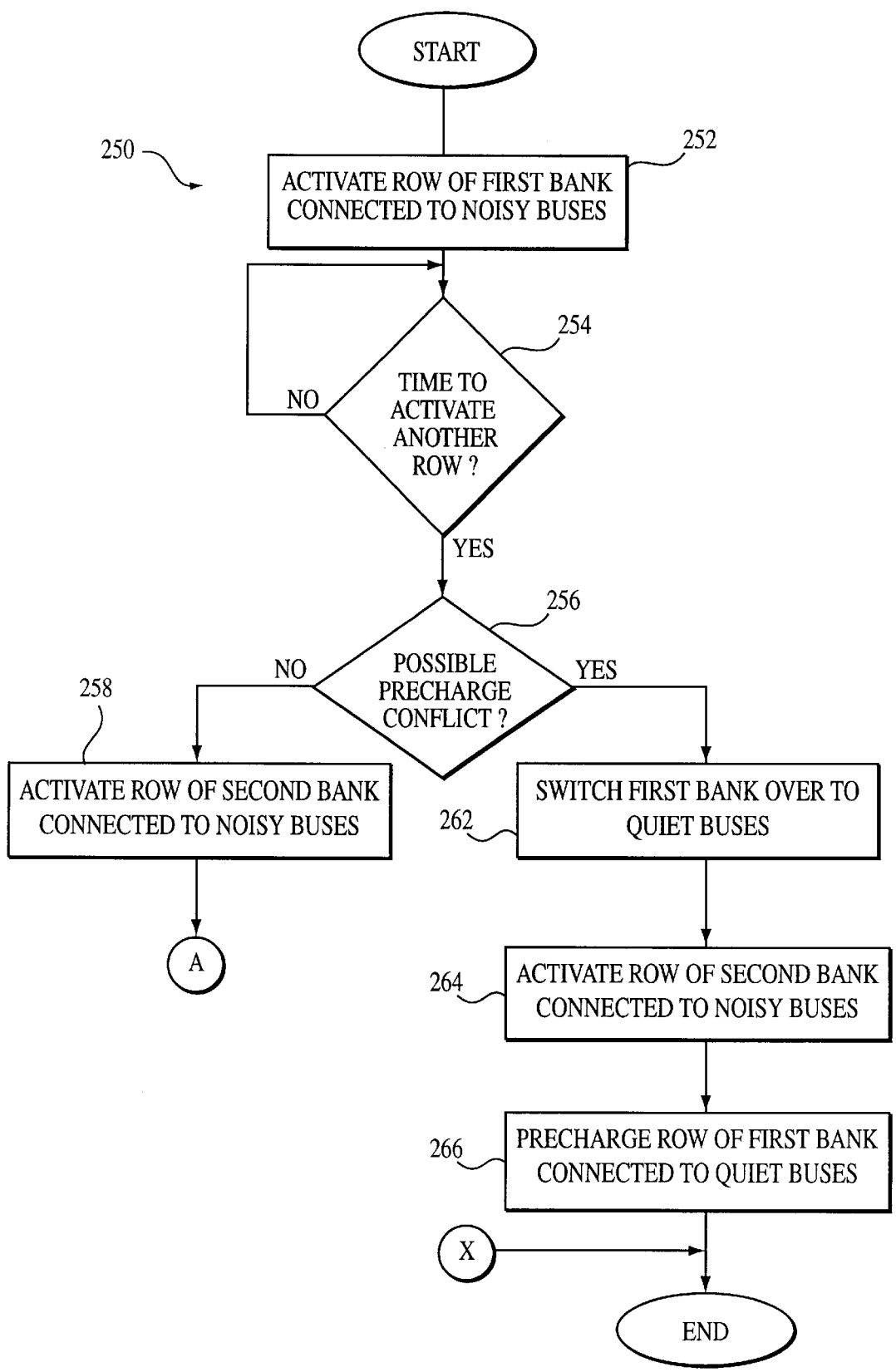
FIGS. 11a and 11b illustrate a second exemplary method of operating a DRAM device constructed in accordance with the present invention.
Figure 11B:
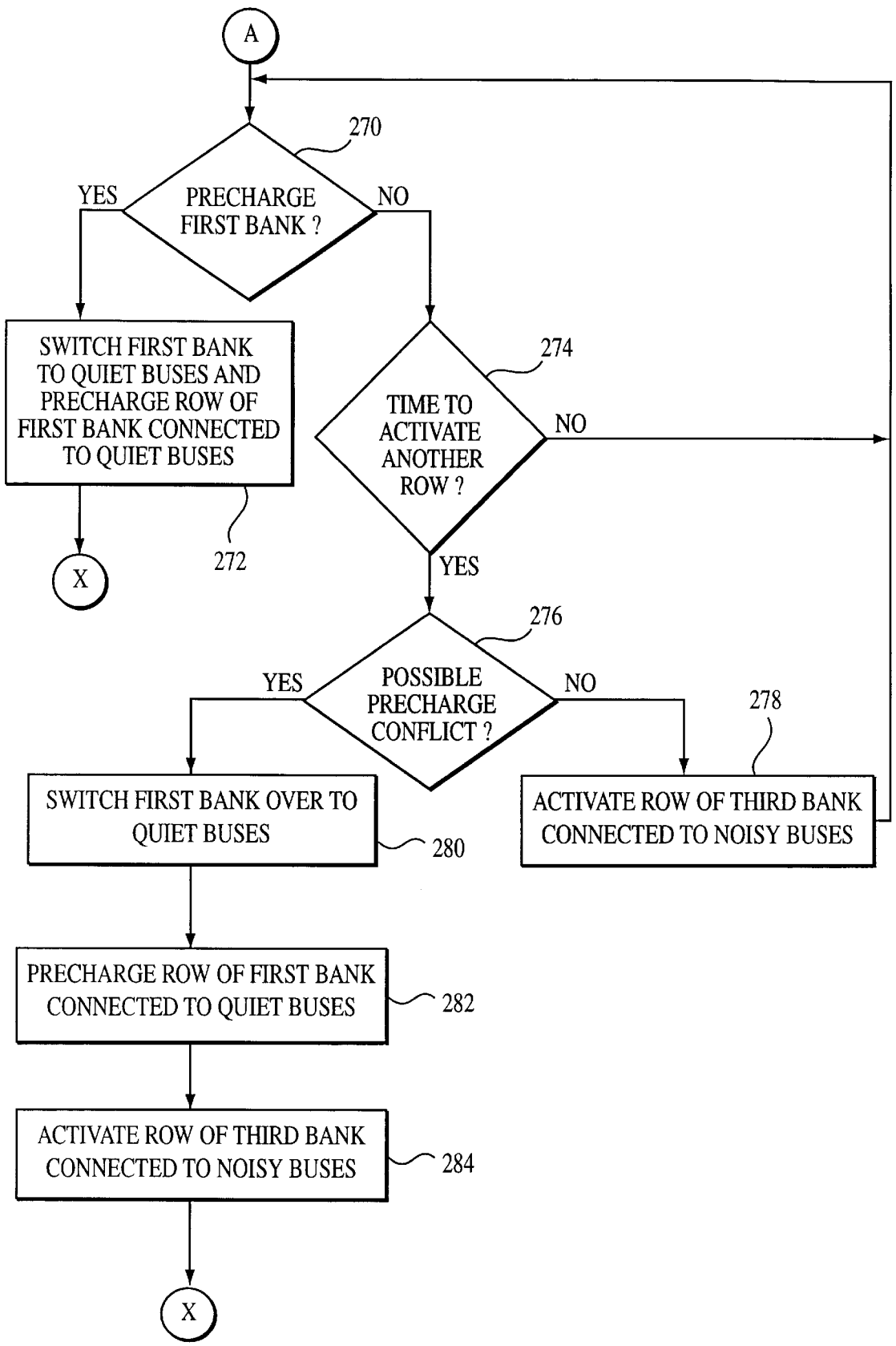

FIGS. 11a and 11b illustrate another exemplary method 250 of operating the DRAM 140 to improve its pause performance. As will be described below in more detail, the method 250 utilizes a modified timing approach when multiplexing between the noisy-quiet buses. Essentially, the method 250 will only switch a bank when there is a "precharge conflict" or potential "precharge conflict." A bank that is about to precharge falls within the potential conflict case because a new row activation request could come in the midst of a precharge, although a bank in precharge could be switched midstream from the noisy to quiet buses too. The phrase "precharge conflict" is used to indicate the situation in which a precharge operation will occur during a power bump on the noisy bus. By switching buses only when a conflict or potential conflict is detected, rows in precharge will achieve even closer levels to VCC and GND potentials.

The method 250 which is performed by the control circuitry 160 (FIG. 8) begins with the activation of a row within a first bank of memory that is connected to the noisy buses (at 252). To perform the row activation using the noisy buses, the control circuitry generates the first and third sense amplifier control signals LPSAN__, LNSAN, which cause the MOSFETs 166, 168 to switch in the $V_{CCN}$ and GNDN buses and generate the ACT and RNL__ signals, respectively.

The method 250 continues by determining if it is time to activate another row connected to the noisy buses (at 254). If it is detected that a row within a second bank connected to the noisy buses is to be activated, the method continues at 256 to determine if there is a possible precharge conflict between the row waiting to be precharged and the row waiting to be activated. As noted above, a conflict would result in a precharge occurring during a power bump, which is undesirable. The precharge conflict can be detected rather easily since the time between activations is known and the time between an activation and a precharge operation is also known (i.e., they are defined by the DRAM specifications). The controller knows the row activation time of the first bank and its expected precharge time. The controller also knows when it can activate the row of the second bank and thus, when the second bank will cause a power bump on the noisy bus. If these times coincide, the controller flags a conflict, otherwise there is no conflict.

If at block 256 is detected that there will be a precharge conflict, the method 250 continues at block 262 where the activated row within the first bank (connected to the noisy buses) is switched to the quiet buses. The switching occurs when the control circuitry generates the second and fourth sense amplifier control signals LPSAQ__, LNSAQ, which cause the MOSFETs 167, 169 to switch in the $V_{CCQ}$ and GNDQ buses. Since the first and third sense amplifier control signals will not be generated at this time, the $V_{CCN}$ and GNDN buses are disconnected from the first bank. It should be noted that the switching should occur after the power bumps decay significantly to minimize any noise problems.

Once switched, the method 250 proceeds by activating a row within a second bank of memory that is connected to the noisy buses (at 264). The row within the first bank that was activated while connected to the noisy buses, but is now connected to the quiet buses, is precharged (at 266). Since the row is connected to the quiet buses (i.e., $V_{CCQ}$ and GNDQ buses), power bumps caused by the activation of the row connected to the noisy buses (i.e., $V_{CCN}$ and GNDN) are not present. Thus, the row is precharged with the nearly full Vcc and GND potentials, which as noted above, will improve the pause performance of the memory.

If at block 256 is detected that there will not be a precharge conflict, the method 250 continues at block 258, where a row within a second bank of memory that is connected to the noisy buses is activated. At this point, the activated rows within the first and second banks are still connected to the noisy buses since there was no need to switch buses. A situation may arise where the DRAM precharge timing specification will not allow the row within the first bank to be precharged at this point. Thus, it becomes important for the control circuitry to determine if another subsequent row activation within another bank connected to the noisy buses will conflict with the precharge operation of the row within the first bank. Accordingly, at step 270, the control circuitry determines if it is time to precharge the row within the first bank.

If it is determined that it is time to precharge the row within the first bank, the row will be switched to the quiet buses and precharged (at block 272) and the method 250 terminates. If at block 270, however, it is determined that it is not time to precharge the row within the first bank, the method 250 determines if it is time to activate another row connected to the noisy buses (at 254). If it is determined that there is no row within another bank connected to the noisy buses is to be activated, the method 250 continues at 270 (described above).

If at block 274 it is determined that a row within a third bank connected to the noisy buses is to be activated, the method continues at 276 to determine if there is a possible precharge conflict between the row waiting to be precharged and the row waiting to be activated. If it is determined that there will be no conflict, the method 250 proceeds by activating a row within the third bank of memory that is also connected to the noisy buses (at 278). The method then continues at block 270 (described above).

If at block 276 is detected that there will be a precharge conflict, the method 250 continues at block 280 where the activated row within the first bank (connected to the noisy buses) is switched to the quiet buses. The switching occurs when the control circuitry generates the second and fourth sense amplifier control signals LPSAQ_, LNSAQ, which cause the MOSFETs 167, 169 to switch in the $V_{CCQ}$ and GNDQ buses. Since the first and third sense amplifier control signals will not be generated at this time, the $V_{CCN}$ and GNDN buses are disconnected from the first bank. It should be noted that the switching should occur after the power bumps decay significantly to minimize any noise problems.

Once switched, the method 250 proceeds by precharging the row within the first bank that was activated while connected to the noisy buses, but is now connected to the quiet buses (at 282) and the row within the third bank of memory that is still connected to the noisy buses is activated (at 284). As noted above, since the precharged row was connected to the quiet buses (i.e., $V_{CCQ}$ and GNDQ buses), power bumps caused by the activation of the row connected to the noisy buses (i.e., $V_{CCN}$ and GNDN) are not present. Thus, the row is precharged with the full Vcc and GND potentials, which as noted above, will improve the pause performance of the memory.

Figure 12:
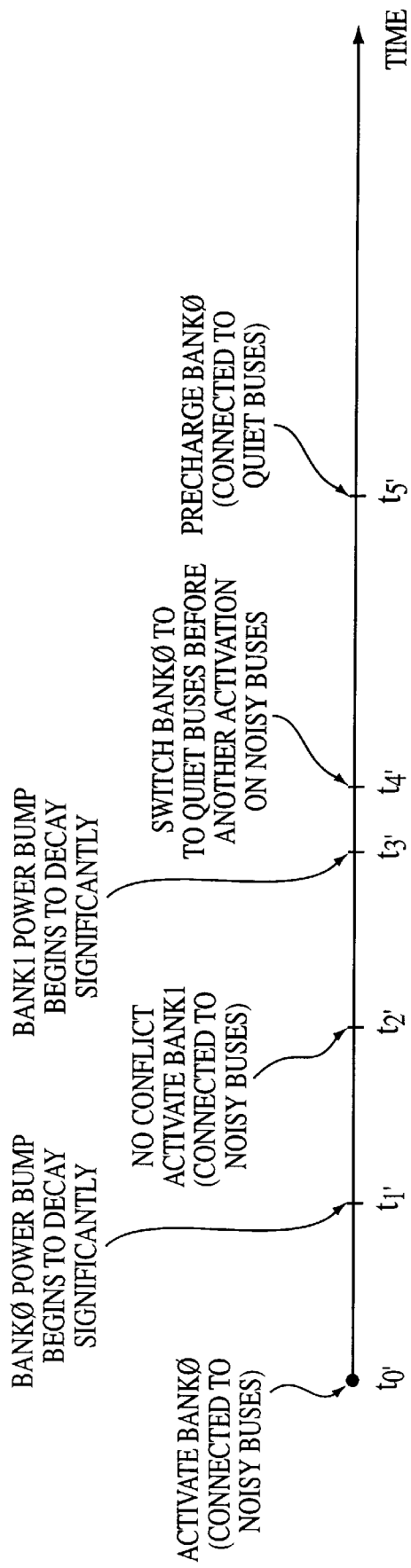
FIGS. 12 and 13 are time lines illustrating an exemplary sequence of events corresponding to the method of FIGS. 11a and 11b.
Figure 13:
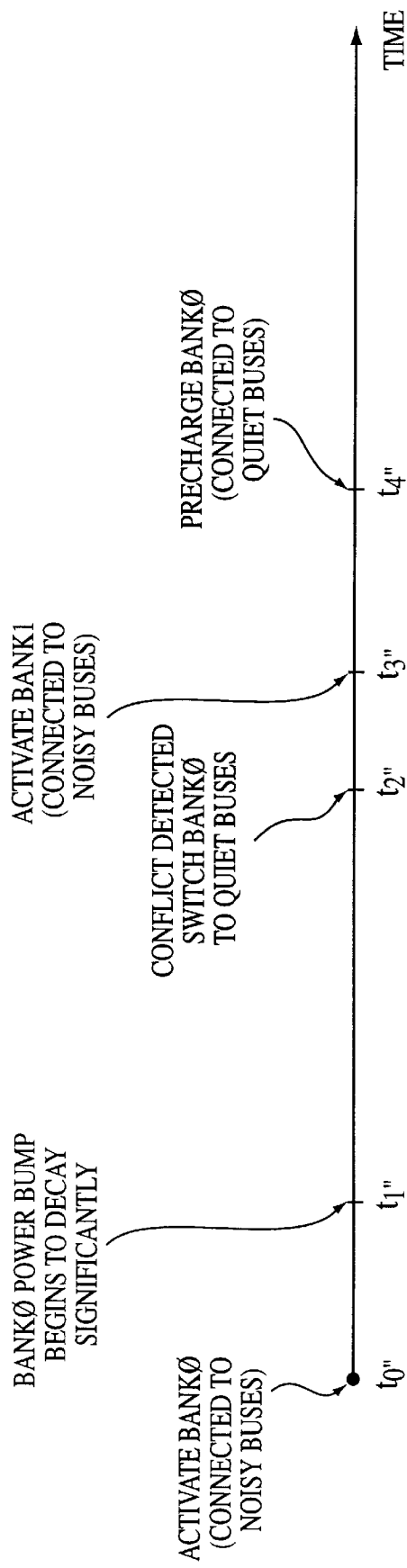

The method 250 is further illustrated by the exemplary time lines of FIGS. 12 and 13. FIG. 12 illustrates the no precharge conflict scenario and FIG. 13 illustrates the precharge conflict scenario.

Referring to FIGS. 11 and 12, at time t0' a row within the first bank ("bank 0") that is connected to the noisy buses is activated (described above with respect to block 252). This activation causes a power bump on the noisy buses. At time t1' the power bump decays significantly. At time t2' the controller detects that a row within a second bank ("bank 1") is going to be activated, but that this activation (and its associated power bump) will not conflict with the future precharge operation for bank 0 which should occur at time t5' (described above with respect to blocks 254 and 256). Absent a conflict, at time t2' a row is activated within bank 1 (described above with respect to block 258).

At time t3' the power bump associated with the row activation of bank 1 decays significantly. At time t4' the controller detects that another row activation will occur on the noisy buses (described above with respect to block 274) and that this activation will result in a precharge conflict with the row of bank 0 (described above with respect to block 276). Thus, the activated row within bank 0 is switched over to the quiet buses (described above with respect to block 280). At time t5' the activated row of bank 0 is precharged while it is connected to the quiet buses (described above with respect to block 282).

Referring to FIGS. 11 and 13, at time t0" a row within the first bank ("bank 0") that is connected to the noisy buses is activated (described above with respect to block 252). This activation causes a power bump on the noisy buses. At time t1" the power bump decays significantly. At time t2" the controller detects that a row within a second bank ("bank 1") is going to be activated and that this activation (and its associated power bump) will conflict with the future precharge operation for bank 0 which should occur at time t4" (described above with respect to blocks 254 and 256). Thus, bank 0 is switched over to the quiet buses (described above with respect to block 262). Shortly thereafter, at time t3" a row within bank 1 that is connected to the noisy buses is activated (described above with respect to block 264). Subsequently, at time t4" the activated row of bank 0 that is now connected to the quiet buses is precharged (described above with respect to block 266).

Figure 14:
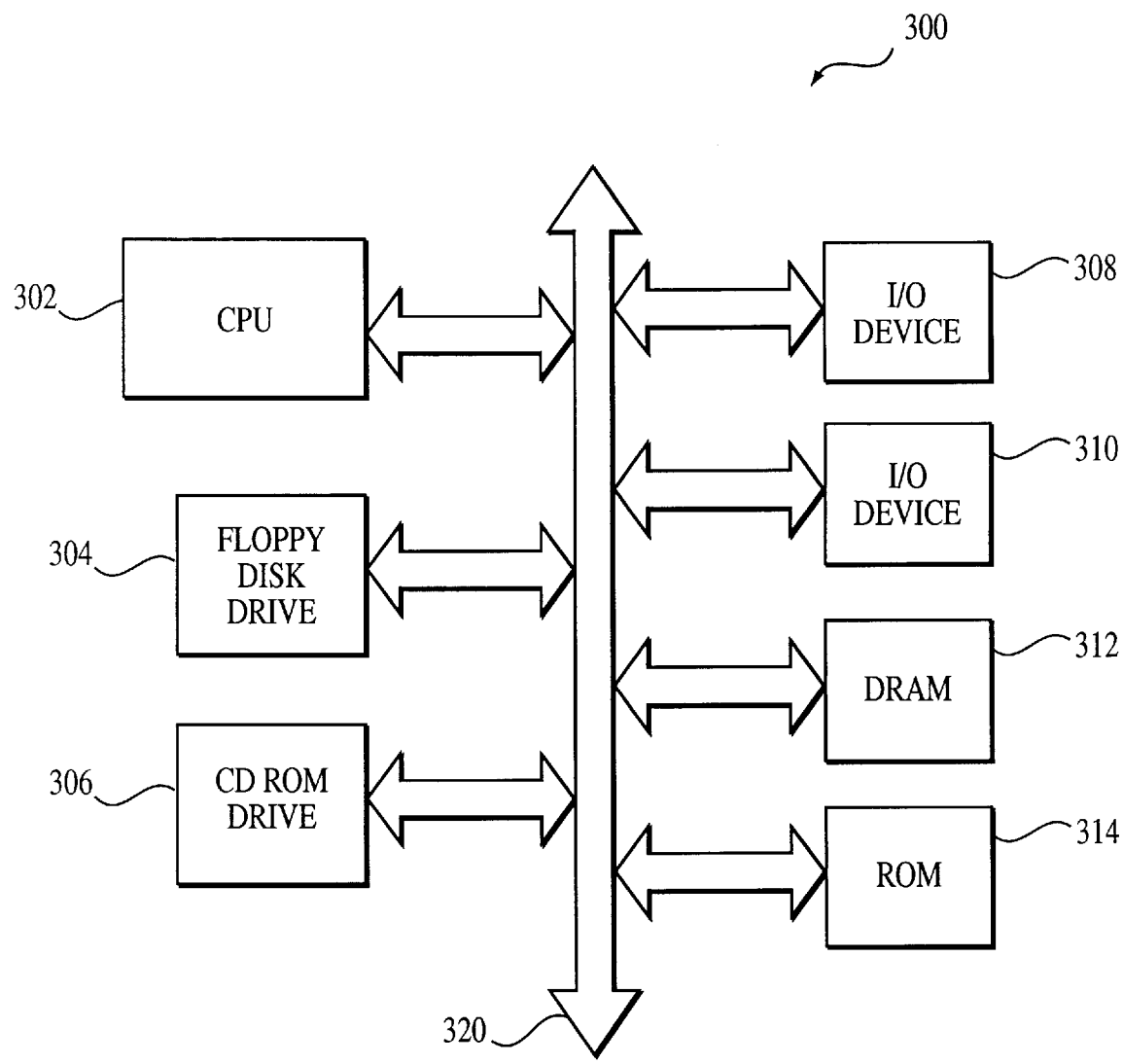
FIG. 14 illustrates a processor-based system utilizing the DRAM of the present invention.

FIG. 14 is a block diagram of a processor-based system 300 utilizing a DRAM 312 constructed in accordance with the present invention. That is, the DRAM 312 utilizes the noisy-quiet multiplexing architecture and method described above with reference to FIGS. 7 to 13. The processor-based system 300 may be a computer system, a process control system or any other system employing a processor and associated memory. The system 300 includes a central processing unit (CPU) 302, e.g., a microprocessor, that communicates with the DRAM 312 and an I/O device 308 over a bus 320. It must be noted that the bus 320 may be a series of buses and bridges commonly used in a processor-based system, but for convenience purposes only, the bus 320 has been illustrated as a single bus. A second I/O device 310 is illustrated, but is not necessary to practice the invention. The processor-based system 300 also includes read-only memory (ROM) 314 and may include peripheral devices such as a floppy disk drive 304 and a compact disk (CD) ROM drive 306 that also communicates with the CPU 302 over the bus 320 as is well known in the art.

FIGS. 11a–13 illustrate a second exemplary method of the present invention. Another alternative can best be described as follows. Let tADECAY represent the delay time from a bank activation until its associated power bumps decay significantly (i.e., to a predetermined acceptable level). Let tACT_PRE represent the minimum required timing between an activate operation and precharge operation for a given bank. After bank 0 is activated on the noisy buses, to maximize the usage of the noisy buses while they are effectively quiet, bank 0 is switched over to the quiet buses only if a subsequent bank 1 activation request occurs at or after tACT_PRE minus tADECAY with respect to bank 0's activation time. If bank 0 has not switched by time tACT_PRE after its activation time, bank 0 will switch to the quiet buses at this time. As another example, After bank 0 is activated on the noisy buses, to maximize the usage of the noisy buses while they are effectively quiet, bank 0 is switched to the quiet buses only if a subsequent bank 1 activation request occurs at or after time tACT_PRE minus tADECAY with respect to bank 0's activation time.

Thus, by incorporating a second set of power buses and a mechanism for multiplexing between the main power buses and the second set of power buses, the present invention is capable of ensuring that the correct voltage levels are stored into the memory cells during refresh operations. By doing so, the present invention improves the pause performance of the DRAM. Since the second set of buses are very small, the present invention improves the pause performance, but does not adversely effect the size of the DRAM chip.

It should be noted that the concept of connecting a single extra bus to the sense amplifier circuitry of a memory device is known in the art. This concept connects a single additional bus having a much higher potential than the $V_{CC}$ bus to the sense amplifier circuitry of the memory device. The higher potential bus has been used to "overdrive" the p-sense amplifier portion of the sense amplifier circuitry during the sensing operation. The overdrive operation is designed to make the sense amplifier circuitry split quicker. It requires very exacting timings to ensure that the p-sense amplifier potentials do not overshoot the $V_{CC}$ potential (or the target array potential), which could cause cell dielectric overstress, early dielectric wear-out and wasted power. If the overdrive timings are undershot, then there can be pause and other performance degradations. These exacting timings are process sensitive and usually require added inverters for proper phasing. Multiple sequential bank activations can cause bumps that will throw this exacting timing off. Despite the additional higher potential bus, problems with power bus bumps during precharge operations remain. Thus, the teachings of the present invention are still required in the memory device having an additional higher potential bus (used as an overdrive mechanism) in order to improve pause performance of the memory device.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory device comprising:
   a plurality of memory arrays, each memory array being organized into rows and columns;
   a plurality of activation circuits, at least one activation circuit being coupled to a respective memory array, each of said activation circuits for activating a deactivated row within its respective memory array and for deactivating an activated row within its respective memory array;
   a first set of power buses connected to said activation circuits; and
   a second set of power buses connected to said activation circuits, wherein said first set of power buses are used to at least activate a row within one of said memory arrays and said second set of power buses are used to insulate said activated row from power variations on said first set of power buses.

2. The device of claim 1 wherein said first set of power buses comprise first and second main power buses for said memory device.

3. The device of claim 2 wherein said second set of power buses comprise first and second auxiliary power buses for said memory device.

4. The device of claim 1 wherein said first set of power buses comprise a first bus having a first voltage and a second bus having a second voltage.

5. The device of claim 4 wherein said first voltage has a positive potential and said second voltage has a ground potential.

6. The device of claim 1 wherein said second set of power buses comprise a first bus having a first voltage and a second bus having a second voltage.

7. The device of claim 6 wherein said first voltage has a positive potential and said second voltage has a ground potential.

8. The device of claim 1 wherein each activation circuit comprises:
   a row decoder coupled to its respective memory array;
   a sense amplifier circuit coupled to its respective memory array; and
   a first control circuit coupled to the sense amplifier circuit and to said first and second power buses, said first control circuit generating activation signals used by said sense amplifier circuit.

9. The device of claim 8 wherein each first control circuit comprises a switching circuit coupled between said first and second set of buses, said switching circuit generates said activation signals from said first set of power buses when said first set of power buses are to activate a row within one of said memory arrays, and said switching circuit generates said activation signals from said second set of power buses to insulate said activated row from power variations on said first set of power buses.

10. The device of claim 9 further comprising a second control circuit connected to and controlling each of said switching circuits, said second control circuit outputting a plurality of control signals to said switching circuits, said plurality of control signals causing said switching circuits to generate said activation signals from said first set of power buses when said first set of power buses are to activate a row within one of said memory arrays and causing said switching circuits to generate said activation signals from said second set of power buses to insulate said activated row from power variations on said first set of power buses.

11. The device of claim 10 wherein said second control circuit is a programmed microprocessor.

12. The device of claim 10 wherein said second control circuit is an application specific integrated circuit.

13. The device of claim 8 wherein each first control circuit is positioned at an intersection of said row decoder and sense amplifier circuit.

14. A dynamic random access memory device comprising:
   a plurality of memory arrays, each memory array being organized into rows and columns;
   a plurality of row decoders, each row decoder being coupled to a respective memory array;
   a plurality of sense amplifier circuits, each sense amplifier circuit being coupled to a respective memory array;

first and second sets of power buses; and a plurality of first control circuits, each first control circuit being coupled to a respective sense amplifier circuit and to said first and second power buses, each first control circuit being responsive to a plurality of control signals and generating activation signals used by its associated sense amplifier circuit; and a second control circuit, said second control circuit outputting said control signals to a specified first control circuit to cause said specified first control circuit to use said first set of power buses to activate a row within one of said memory arrays and said second set of power buses to insulate said activated row from power variations on said first set of power buses.

15. A memory device comprising:

a plurality of memory arrays, each memory array being organized into rows and columns;

a plurality of activation circuits, at least one activation circuit being coupled to a respective memory array, each of said activation circuits for activating a deactivated row within its respective memory array and for deactivating an activated row within its respective memory array;

first and second sets of power buses connected to said activation circuits; and a memory controller connected to said activation circuits, said controller activating a row of memory cells within one of said arrays using said first set of power buses, and using said second set of power buses to insulate said activated row from power variations on said first set of power buses.

16. The device of claim 15 wherein said controller activates a row of memory cells within another one of said memory arrays using said first set of power buses.

17. The device of claim 15 wherein said controller activates a row of memory cells by generating a plurality of activation signals using said first set of power buses, and providing said plurality of activation signals to sense amplifier circuitry within an activation circuit connected to a row to be activated.

18. The device of claim 15 wherein said controller insulates said activated row by generating a switching signal to switch sense amplifier activation to said second set of power buses.

19. The device of claim 15 wherein said controller insulates said activated row by determining if activating a row of memory cells within another one of said memory arrays using said first set of power buses will cause a power bump effecting a voltage level to be used with a precharge operation on a row to be deactivated, and if it is determined that there will be a power bump effecting a voltage level to be used with a precharge operation on the row to be deactivated, generating a switching signal to switch sense amplifier activation to said second set of power buses.

20. The device of claim 19 wherein if said controller determines that there will not be a power bump effecting a voltage level to be used with a precharge operation on the row to be deactivated, said controller activates a row of memory cells within another one of said memory arrays using said first set of power buses, determines if activating a row of memory cells within a third one of said memory arrays using said first set of power buses will cause a power bump effecting a voltage level to be used with a precharge operation on the row to be deactivated, and if it is determined that there will be a power bump, generating a switching signal to switch sense amplifier activation to said second set of power buses.

21. The device of claim 15 wherein said controller insulates said activated row by determining if a request to activate an additional row of memory cells occurs at or after a predetermined time after an activation time of the activated row, wherein the predetermined time is defined by a specified activation to precharge time minus a power bump decay time, and if the request to activate an additional row occurs at or after the predetermined time, generating a switching signal to switch sense amplifier activation to said second set of power buses.

22. A processor based system comprising:

a processor; and a memory device coupled to said processor, said memory device comprising:

a plurality of memory arrays, each memory array being organized into rows and columns;

a plurality of activation circuits, at least one activation circuit being coupled to a respective memory array, each of said activation circuits for activating a deactivated row within its respective memory array and for deactivating an activated row within its respective memory array;

a first set of power buses connected to said activation circuits; and a second set of power buses connected to said activation circuits, wherein said first set of power buses are used to at least activate a row within one of said memory arrays and said second set of power buses are used to insulate said activated row from power variations on said first set of power buses.

23. The system of claim 22 wherein said first set of power buses comprise first and second main power buses for said memory device.

24. The system of claim 22 wherein said second set of power buses comprise first and second auxiliary power buses for said memory device.

25. The system of claim 22 wherein said first set of power buses comprise a first bus having a first voltage and a second bus having a second voltage.

26. The system of claim 25 wherein said first voltage has a positive potential and said second voltage has a ground potential.

27. The system of claim 22 wherein said second set of power buses comprise a first bus having a first voltage and a second bus having a second voltage.

28. The system of claim 27 wherein said first voltage has a positive potential and said second voltage has a ground potential.

29. The system of claim 22 wherein each activation circuit comprises:

a row decoder coupled to its respective memory array;

a sense amplifier circuit coupled to its respective memory array; and a first control circuit coupled to the sense amplifier circuit and to said first and second power buses, said first control circuit generating activation signals used by said sense amplifier circuit.

30. The system of claim 29 wherein each first control circuit comprises a switching circuit coupled between said first and second set of buses, said switching circuit generates said activation signals from said first set of power buses when said first set of power buses are to activate a row within one of said memory arrays, and said switching circuit generates said activation signals from said second set of power buses to insulate said activated row.

31. The system of claim 30 further comprising a second control circuit connected to and controlling each of said switching circuits, said second control circuit outputting a plurality of control signals to said switching circuits, said plurality of control signals causing said switching circuits to generate said activation signals from said first set of power buses when said first set of power buses are to activate a row within one of said memory arrays and causing said switching circuits to generate said activation signals from said second set of power buses to insulate said activated row.

32. The system of claim 31 wherein said second control circuit is an application specific integrated circuit.

33. The system of claim 29 wherein each first control circuit is positioned at an intersection of said row decoder and sense amplifier circuit.

34. A processor based system comprising:
a processor; and
a memory device coupled to said processor, said memory device comprising:
a plurality of memory arrays, each memory array being organized into rows and columns;
a plurality of row decoders, each row decoder being coupled to a respective memory array;
a plurality of sense amplifier circuits, each sense amplifier circuit being coupled to a respective memory array;
first and second sets of power buses; and
a plurality of first control circuits, each first control circuit being coupled to a respective sense amplifier circuit and to said first and second power buses, each first control circuit being responsive to a plurality of control signals and generating activation signals used by its associated sense amplifier circuit; and
a second control circuit, said second control circuit outputting said control signals to a specified first control circuit to cause said specified first control circuit to use said first set of power buses to activate a row within one of said memory arrays and said second set of power buses to insulate said activated row from power variations on said first set of power buses.

35. A method of operating a memory device having a plurality of memory arrays connected to respective activation circuits, the activation circuits being coupled to first and second sets of power buses, said method comprising the steps of:
activating a row of memory cells within one of the memory arrays using the first set of power buses; and
deactivating the activated row of memory cells using the second set of power buses by determining if activating a row of memory cells within another one of the memory arrays using the first set of power buses will cause a power bump effecting a voltage level to be used with a precharge operation on a row to be deactivated, and if it is determined that there will be a power bump, generating a plurality of deactivation signals using the second set of power buses, providing the plurality of deactivation signals to sense amplifier circuitry within an activation circuit connected to the row to be deactivated and precharging the row to be deactivated.

36. The method of claim 35 further comprising the step of activating a row of memory cells within another one of the memory arrays using the first set of power buses.

37. The method of claim 35 wherein said activating step comprises:
generating a plurality of activation signals using the first set of power buses; and
providing the plurality of activation signals to sense amplifier circuitry within an activation circuit connected to a row to be activated.

38. The method of claim 35 wherein if it is determined that there will not be a power bump effecting a precharge operation of the row to be deactivated, said method further comprises the steps of:
activating a row of memory cells within another one of the memory arrays using the first set of power buses;
determining if activating a row of memory cells within a third one of the memory arrays using the first set of power buses will cause a power bump effecting a voltage level to be used with a precharge operation on a row to be deactivated; and
if it is determined that there will be a power bump effecting a voltage level to be used with a precharge operation on the row to be deactivated, generating a plurality of deactivation signals using the second set of power buses, providing the plurality of deactivation signals to sense amplifier circuitry within an activation circuit connected to the row to be deactivated and precharging the row to be deactivated.

39. A method of operating a memory device having a plurality of memory arrays connected to respective activation circuits, the activation circuits being coupled to first and second sets of power buses and a control circuit, said method comprising the steps of:
activating a row of memory cells within one of the memory arrays using the first set of power buses by outputting a plurality of control signals from the control circuit to an activation circuit connected to a row to be activated, using the control signals to generate a plurality of activation signals using the first set of power buses, and providing the plurality of activation signals to sense amplifier circuitry within an activation circuit connected to the row to be activated; and
deactivating the activated row of memory cells using the second set of power buses, by:
determining if activating a row of memory cells within another one of the memory arrays using the first set of power buses will cause a power bump effecting a voltage level to be used with a precharge operation on the row to be deactivated; and
if it is determined that there will be a power bump effecting a voltage level to be used with a precharge operation on the row to be deactivated, outputting a plurality of control signals from the control circuit to an activation circuit connected to a row to be deactivated, using the control signals to generate a plurality of deactivation signals using the second set of power buses, providing the plurality of deactivation signals to sense amplifier circuitry within an activation circuit connected to the row to be deactivated and precharging the row to be deactivated.

40. A method of operating a memory device having a plurality of memory arrays connected to respective activation circuits, the activation circuits being coupled to first an second sets of power buses and a control circuit, said method comprising the steps of:
activating a row of memory cells within one of the memory arrays using the first set of power buses by outputting a plurality of control signals from the control circuit to activation circuit connected to a row to be activated, using the control signals to generate a plurality of activation signals using the first set of power buses, and providing the plurality of activation signals to sense amplifier circuitry within an activation circuit connected to the row to be activated; and
deactivating the activated row of memory cells using the second set of power buses, by:

outputting a plurality of control signals from the control circuit to an activation circuit connected to a row to be deactivated;

using the control signals to generate a plurality of deactivation signals using the second set of power buses;

providing the plurality of deactivation signals to sense amplifier circuitry within an activation circuit connected to the row to be deactivated; and precharging the row to be deactivated activating a row of memory cells within another one of the memory arrays using the first set of power buses;

determining if activating a row of memory cells within a third one of the memory arrays using the first set of power buses will cause a power bump effecting a voltage level to be used with a recharge operation on the row to be deactivated; and if it is determined that there will be a power bump effecting a voltage level to be used with a precharge operation on the row to be deactivated, generating a plurality of deactivation signals using the second set of power buses, providing the plurality of deactivation signals to sense amplifier circuitry within an activation circuit connected to the row to be deactivated and precharging the row to be deactivated.

41. A method of operating a memory device having a plurality of memory arrays connected to respective activation circuits, the activation circuits being coupled to first and second sets of power buses, said method comprising the steps of:

activating a row of memory cells within one of the memory arrays using the first set of power buses; and switching the activated row of memory cells to the second set of power buses to insulate the activated row from power variations on the first set of power buses.

42. The method of claim 41 wherein a control circuit is connected to each of the activation circuits and wherein said activating step comprises:

outputting a plurality of control signals from the control circuit to an activation circuit connected to a row to be activated;

using the control signals to generate a plurality of activation signals using the first set of power buses; and providing the plurality of activation signals to sense amplifier circuitry within an activation circuit connected to the row to be activated.

43. A method of operating a memory device having a plurality of memory arrays connected to respective activation circuits, the activation circuits being coupled to first and second sets of power buses, said method comprising the steps of:

activating a row of memory cells within one of the memory arrays using the first set of power buses; and deactivating the activated row of memory cells using the second set of power buses by determining if a request to activate an additional row of memory cells occurs at or after a predetermined time after an activation time of the activated row, wherein the predetermined time is defined by a specified activation to precharge time minus a power bump decay time; and if it is determined that the request to activate an additional row occurs at or after the predetermined time, generating a plurality of deactivation signals using the second set of power buses, providing said plurality of deactivation signals to sense amplifier circuitry within an activation circuit connected to the row to be deactivated and precharging the row to be deactivated.

* * * * *

UNITED STATES PATENT AND TRADEMARK OFFICE
CERTIFICATE OF CORRECTION

PATENT NO.    : 6,219,294 B1
DATED         : April 17, 2001
INVENTOR(S)   : Brian W. Huber, et al.

It is certified that error appears in the above-identified patent and that said Letters Patent is hereby corrected as shown below:

Column 2:
Line 15, "42Δ" should read -- 42' --.

Column 16:
Claim 40, line 3, "an" should read -- and --.
Claim 40, line 9, "to activation" should read -- to an activation --.

Signed and Sealed this

Eleventh Day of September, 2001

Attest:

NICHOLAS P. GODICI
Attesting Officer    Acting Director of the United States Patent and Trademark Office